(12) United States Patent
Essers et al.

(10) Patent No.: US 12,362,129 B2
(45) Date of Patent: Jul. 15, 2025

(54) PARTICLE BEAM COLUMN

(71) Applicant: Carl Zeiss Microscopy GmbH, Jena (DE)

(72) Inventors: Erik Essers, Aalen (DE); Björn Gamm, Koenigsbronn (DE)

(73) Assignee: Carl Zeiss Microscopy GmbH, Jena (DE)

( * ) Notice: Subject to any disclaimer, the term of this patent is extended or adjusted under 35 U.S.C. 154(b) by 468 days.

(21) Appl. No.: 17/896,463

(22) Filed: Aug. 26, 2022

(65) Prior Publication Data
US 2023/0065039 A1 Mar. 2, 2023

(30) Foreign Application Priority Data
Aug. 30, 2021 (DE) .......................... 102021122388.1

(51) Int. Cl.
*H01J 37/145* (2006.01)
*H01J 37/147* (2006.01)
(Continued)

(52) U.S. Cl.
CPC ........ *H01J 37/145* (2013.01); *H01J 37/1471* (2013.01); *H01J 37/244* (2013.01); *H01J 37/28* (2013.01); *H01J 2237/0453* (2013.01)

(58) Field of Classification Search
CPC .... H01J 37/145; H01J 37/1471; H01J 37/244; H01J 37/28; H01J 2237/0453;
(Continued)

(56) References Cited

U.S. PATENT DOCUMENTS 2,468,403 A * 4/1949 Liebmann ............... H01J 37/02
                                                          313/442
4,140,913 A * 2/1979 Anger .................. H01J 37/3007
                                                          250/398
(Continued)

FOREIGN PATENT DOCUMENTS

DE          42 43 489 A1      6/1994

OTHER PUBLICATIONS

German Office Action, with translation thereof, for corresponding DE application No. 10 2021 122 388.1 dated Jun. 2, 2022.

*Primary Examiner* — David A Vanore
(74) *Attorney, Agent, or Firm* — Fish & Richardson P.C.

(57) ABSTRACT

A particle beam column generates a particle beam of charged particles, for example electrons or ions, and direct it onto a sample. The particle beam column comprises a multi-aperture stop and a deflection system for selectively steering the particle beam through one of a plurality of apertures provided in the multi-aperture stop. The apertures have different sizes in order to limit the current strength of the particle beam to different values. The particle beam column furthermore comprises a lens for changing the divergence angle of the particle beam upstream of a first stop. The lens can comprise a magnetic lens, which comprises a magnetic core with a plurality of parts, which are electrically insulated from one another and can have substantially different electrical potentials during operation. Some of the parts of the magnetic core can have the same electrical potential as the first stop during operation.

24 Claims, 5 Drawing Sheets

(51) Int. Cl.
*H01J 37/244* (2006.01)
*H01J 37/28* (2006.01)

(58) Field of Classification Search
CPC ..... H01J 2237/1501; H01J 2237/24535; H01J 2237/24542; H01J 37/09
See application file for complete search history.

(56) References Cited

U.S. PATENT DOCUMENTS

| | | | | |
|---|---|---|---|---|
| 4,546,258 | A * | 10/1985 | Chisholm | H01J 37/3007 250/398 |
| 5,051,556 | A * | 9/1991 | Sakamoto | B82Y 10/00 219/121.25 |
| 5,254,856 | A * | 10/1993 | Matsui | H01J 37/12 850/16 |
| 5,483,073 | A * | 1/1996 | Benner | H01J 37/26 250/311 |
| 5,747,819 | A * | 5/1998 | Nakasuji | B82Y 40/00 250/492.23 |
| 5,912,469 | A * | 6/1999 | Okino | B82Y 40/00 250/492.23 |
| 6,576,908 | B1 * | 6/2003 | Winkler | H01J 37/301 250/492.1 |
| 6,590,210 | B1 * | 7/2003 | Essers | H01J 37/244 250/397 |
| 6,897,442 | B2 * | 5/2005 | Petrov | H01J 37/145 250/397 |
| 7,109,487 | B2 * | 9/2006 | Kienle | H01J 37/3056 250/311 |
| 7,397,031 | B2 * | 7/2008 | Shinada | H01J 37/28 250/307 |
| 7,523,009 | B2 * | 4/2009 | Preikszas | H01J 37/265 250/311 |
| 8,890,092 | B2 * | 11/2014 | Kim | G21K 5/04 250/492.23 |
| 11,158,485 | B2 * | 10/2021 | Schmaunz | H01J 37/28 |
| 2004/0159787 | A1 * | 8/2004 | Nakasuji | H01J 37/28 250/311 |
| 2007/0181806 | A1 * | 8/2007 | Nakano | H01J 37/153 250/310 |
| 2010/0224781 | A1 * | 9/2010 | Hosokawa | H01J 37/153 250/311 |
| 2012/0138814 | A1 * | 6/2012 | Preikszas | H01J 37/28 250/396 R |
| 2012/0295202 | A1 * | 11/2012 | Sano | H01J 37/3007 430/296 |
| 2012/0295203 | A1 * | 11/2012 | Sano | B82Y 40/00 430/296 |
| 2014/0077077 | A1 * | 3/2014 | Jiang | H01J 37/09 315/111.81 |
| 2015/0213998 | A1 * | 7/2015 | Winkler | H01J 37/1474 250/396 ML |
| 2016/0071689 | A1 * | 3/2016 | de Jong | H01J 37/26 250/311 |
| 2016/0086762 | A1 * | 3/2016 | de Jong | H01J 37/21 250/307 |
| 2016/0155603 | A1 * | 6/2016 | Zeidler | B82Y 10/00 250/396 R |
| 2016/0203948 | A1 * | 7/2016 | Huynh | H10N 60/0884 250/398 |
| 2016/0240344 | A1 * | 8/2016 | Kemen | H01J 37/3177 |
| 2017/0352517 | A1 * | 12/2017 | Shichi | H01J 37/28 |
| 2018/0330912 | A1 * | 11/2018 | Drexel | H01J 37/26 |
| 2020/0185185 | A1 * | 6/2020 | Essers | H01J 37/09 |
| 2020/0211810 | A1 | 7/2020 | Zeidler | |
| 2023/0065039 | A1 * | 3/2023 | Essers | H01J 37/28 |
| 2023/0065373 | A1 * | 3/2023 | Gamm | H01J 37/06 |
| 2024/0304410 | A1 * | 9/2024 | Essers | H01J 37/26 |

* cited by examiner

PARTICLE BEAM COLUMN

CROSS-REFERENCE TO RELATED APPLICATION

This application claims benefit under 35 U.S.C. § 119 to German Application No. 10 2021 122 388.1, filed Aug. 30, 2021. The contents of this application is hereby incorporated by reference in its entirety.

FIELD

The present disclosure relates to a particle beam column, such as an electron beam column, for example a scanning electron microscope, or an ion beam column. For example, the disclosure relates to the maximization of the current strength of a particle beam of charged particles to be guided onto a sample and to the provision of a high dynamic range for the current strength of the particle beam.

BACKGROUND

A conventional particle beam column generally comprises a particle beam generator for generating a particle beam of charged particles and an anode stop, to which an anode voltage (high voltage with respect to the particle beam generator) is applied in order to accelerate the particles to a predetermined energy. The anode stop has an aperture, that is to say an opening in the anode stop, through which part of the particle beam passes. Another part of the particle beam is blocked by the anode stop.

The current strength of the particle flux is therefore, in general, limited by the anode stop. In an electron beam microscope, for example, this limitation of the current strength of the particle beam can mean that the dwell time of the particle beam at a position on a sample is chosen to be relatively long so as to obtain a sufficient signal strength for a detection signal. The relatively long dwell time of the electron beam at a position on the sample generally leads to a high duration for recording an image of the sample.

In addition to the maximum possible current strength of the particle beam that is incident on the sample, the dynamic range of the current strength of the particle beam is also a performance feature of a particle beam column. The dynamic range denotes the range of values within which the current strength of the particle beam is able to be varied, and the number of setting options within the range of values. Some applications of a particle beam column use a high current strength of the particle beam; other applications use a low current strength of the particle beam.

SUMMARY

The present disclosure seeks to provide a particle beam column suitable for generating a particle beam having a high maximum current strength and having a high dynamic range for the current strength of the particle beam.

A first aspect of the disclosure relates to a particle beam column comprising: a particle beam generator for generating a particle beam of charged particles; a first stop having an aperture onto which the particle beam is directed during operation; a first lens, which is configured to variably set a divergence angle of the particle beam upstream of the first stop, as a result of which the current strength of the particle beam passing through the aperture of the first stop is variably selectable; a multi-aperture stop, arranged downstream of the first stop, having a plurality of differently sized apertures arranged one next to another; a deflection system configured to selectively deflect the particle beam downstream of the first stop onto one of the apertures of the multi-aperture stop; wherein the first lens is configured to set, in interaction with the first stop, the divergence angle of the particle beam during operation such that the particle beam is directed onto exactly one of the apertures of the multi-aperture stop; and an objective lens which is arranged downstream of the multi-aperture stop and is configured to focus the particle beam passing through the selected aperture of the multi-aperture stop.

In the present description, "a first object is arranged upstream of a second object" and "a second object is arranged downstream of a first object" each mean that the first object is arranged ahead of the second object along the direction of propagation of the particle beam. The particle beam accordingly reaches the position of the first object first, and then the position of the second object. The term "upstream" may also mean "counter to the propagation direction of the particle beam". The term "downstream" may also mean "along the propagation direction of the particle beam".

The particle beam generator comprises for example a particle source, which is configured to emit charged particles, a suppression electrode, which is configured to block particles emitted thermally by the particle source by applying an appropriate voltage, and an extraction electrode, which is configured to extract from the particle source particles charged by applying an appropriate voltage (referred to as field emission). The extraction electrode is arranged here downstream of the particle source. The extraction electrode has an aperture through which the particle beam passes.

The first stop can be, for example, an anode stop having an aperture through which the particle beam passes. The anode stop can serve to accelerate the particles generated by the particle beam generator. To this end, a voltage, also referred to as anode voltage, can be applied to the anode stop. As the anode voltage, for example, a voltage is applied between the extraction electrode and the anode stop in a manner such that the charged particles of the particle beam are accelerated to a kinetic energy of the order of magnitude of 5 keV to 40 keV, such as 8 keV to 30 keV.

Alternatively, the first stop can be an auxiliary stop arranged downstream of the anode stop. The auxiliary stop has an aperture through which the particle beam passes. The auxiliary stop can serve to delimit the diameter of the particle beam in a manner such that the particle beam is incident on only exactly one of the apertures of the multi-aperture stop.

The multi-aperture stop, which is arranged downstream of the first stop, can have a plurality of apertures (that is to say, openings) in the multi-aperture stop. The apertures can have different sizes. The size of the apertures generally lies in the region of the settable cross section of the particle beam in the plane of the multi-aperture stop. Some of the apertures can be smaller than the cross section of the particle beam in the plane of the multi-aperture stop, as a result of which that part of the particle beam that is incident on the aperture can pass through the multi-aperture stop, whereas the part of the particle beam that is incident next to the aperture on the multi-aperture stop is blocked thereby and consequently cannot pass through the multi-aperture stop. As a result, the current strength of the particle beam can be effectively limited. The differently sized apertures consequently can allow the current strength of the particle beam to be set to a multiplicity of different values.

Some of the apertures can also be larger than the cross section of the particle beam in the plane of the multi-aperture stop, as a result of which the particle beam can be incident on the aperture in its entirety and can consequently pass through the multi-aperture stop in its entirety.

The deflection system can serve to optionally direct the particle beam that has passed the first stop through the aperture in the first stop, onto one of the apertures of the multi-aperture stop. That means that the deflection system can steer the particle beam onto each of the apertures of the multi-aperture stop. The deflection system thereby can deflect the particle beam upstream of the multi-aperture stop. The deflection system can furthermore serve to direct the particle beam that has passed the multi-aperture stop through one of the apertures of the multi-aperture stop, onto the objective lens. The deflection system for this purpose again can deflect the particle beam downstream of the multi-aperture stop.

The first lens can be used to increase the maximum current strength of the particle beam that can be supplied to the sample. The first lens can furthermore be used to be able to variably set the current strength of the particle beam. The first lens can be or comprise a magnetic lens. The first lens can be or comprise an electrostatic lens.

For example, the first lens generates upstream of the first stop, that is to say between the particle source and the first stop, a magnetic field and/or an electric field, which is/are suitable for focusing the particle beam upstream of the first stop. For example, the first lens generates the magnetic field or the electric field in a manner such that the focusing effect is primarily present upstream of the first stop. That means for example that a change in the propagation direction of a particle of the particle beam which is brought about by the first lens upstream of the first stop is greater than a change in the propagation direction of the particle that is brought about by the first lens downstream of the first stop.

Owing to the focusing, the divergence angle of the particle beam upstream of the first stop can be changed. This can bring about a change in the beam diameter in the plane of the first stop, so that the portion of the particle beam that passes through the aperture of the first stop can effectively be variably set. In this way, the current strength of the particle beam that can be transported through the aperture of the first stop can be increased and be continuously and variably set. This can bring about a change in the beam diameter in the plane of multi-aperture stop, so that the portion of the particle beam that passes through one of the apertures of the multi-aperture stop can effectively be continuously and variably set. In this way, the current strength of the particle beam that can be transported through the multi-aperture stop can be increased and be variably set.

A second aspect of the disclosure relates to a particle beam column comprising: a particle beam generator for generating a particle beam of charged particles; a first stop having an aperture through which the particle beam passes; a first lens comprising a magnetic lens, which is configured to generate, upstream of the first stop, a magnetic field for focusing the particle beam; wherein the magnetic lens comprises a magnetic core for channeling the magnetic field and an excitation coil for generating the magnetic field; an objective lens which is arranged downstream of the first lens and is configured to focus the particle beam onto a sample; and a controller, which is configured to operate the particle beam column in an operating mode in which a voltage is applied between the first stop and the sample or between the first stop and the sample holder on which the sample is positioned and in which at least a part of the magnetic core of the magnetic lens and the first stop substantially have the same electrical potential.

The first stop can be, for example, an anode stop having an aperture through which the particle beam passes. The anode stop can serve to accelerate the particles generated by the particle beam generator. To this end, a voltage, also referred to as anode voltage, can be applied to the anode stop. As the anode voltage, for example, a voltage is applied between the extraction electrode and the anode stop in a manner such that the charged particles of the particle beam are accelerated to a kinetic energy of the order of magnitude of 5 keV to 40 keV, such as 8 keV to 30 keV.

Alternatively, the first stop can be an auxiliary stop arranged downstream of the anode stop. The auxiliary stop can have an aperture through which the particle beam passes. The auxiliary stop can serve to delimit the diameter of the particle beam in a manner such that the particle beam is incident on only exactly one of the apertures of the multi-aperture stop.

The first lens can be used to increase the maximum current strength of the particle beam that can be supplied to the sample. The first lens can furthermore be used to be able to variably set the current strength of the particle beam. For this purpose, the magnetic lens of the first lens can generate a magnetic field, which is suitable for focusing the particle beam. The magnetic lens can be designed such that the magnetic field mainly acts upstream of the first stop (anode stop, auxiliary stop). That means for example that a change in the propagation direction of a particle of the particle beam which is brought about by the first lens upstream of the first stop is greater than a change in the propagation direction of the particle that is brought about by the first lens downstream of the first stop.

Owing to the magnetic field, the divergence angle of the particle beam upstream of the first stop can be changed. This can bring about a change in the beam diameter in the plane of the first stop, so that the portion of the particle beam that passes through the aperture of the first stop can effectively be variably set. In this way, the current strength of the particle beam that can be transported through the aperture of the first stop can be increased and be variably set.

The effectiveness of the magnetic field can be limited by the geometry of the components of the particle beam column. The particle beam generator typically comprises a housing which serves as vacuum chamber and in which the particle source, the suppression electrode, and the extraction electrode are arranged. During operation, an ultra-high vacuum is usually produced within the vacuum chamber. In general, the construction shape of the vacuum chamber cannot be changed arbitrarily without adversely affecting the ultra-high vacuum. For this reason, the magnetic lens of the first lens is typically arranged outside of the ultra-high vacuum, that is to say outside of the vacuum chamber.

In order to still be able to generate a sufficiently strong magnetic field despite these limitations with respect to the construction shape of the components of the particle beam column, it is proposed to arrange the magnetic core of the magnetic lens of the first lens in the vicinity of the first stop. In order to be able to arrange the magnetic core of the magnetic lens of the first lens in the vicinity of the first stop, it is proposed to set during operation one part of the magnetic core, optionally the part of the magnetic core that is arranged in the vicinity of the first stop, to substantially the same electrical potential as the first stop itself. For example, the part of the magnetic core and the first stop are electrically conductively connected to one another and therefore have substantially the same electrical potential during operation.

During operation, the controller can cause the generation of a voltage between the first stop and the sample or between the first stop and the sample holder on which the sample is positioned. In some operating modes, the voltage can lie between 3 kV and 10 kV, such as 8 kV. Consequently, a voltage of this magnitude can also be present between the part of the magnetic core and a sample or between the part of the magnetic core and the sample holder.

The particle beam column can furthermore comprise a beam tube in which the particle beam travels. The first stop can be arranged in the beam tube. The magnetic lens of the first lens can be arranged outside of the beam tube. The first stop and a beam tube can have the same electrical potential during operation. The part of the magnetic core and the beam tube can have the same electrical potential during operation.

These configurations of the electrical potentials can make it possible to reduce or omit electrical insulations between these components. The space that is saved in this way can be used to optimize the arrangement and shape of the magnetic core of the magnetic lens of the first lens. The particle beam column according to the second aspect therefore can make it possible to generate a relatively strong magnetic field upstream of the first stop, as a result of which the maximum current strength of the particle beam can be increased compared to conventional particle beam columns. With variable excitation of the first lens, it is additionally possible to variably set the current strength of the particle beam that passes through the first stop through its aperture.

A third aspect of the disclosure relates to a particle beam column comprising: a particle beam generator for generating a particle beam of charged particles; a first stop having an aperture through which the particle beam passes; a first lens comprising a magnetic lens, which is configured to generate upstream of the first stop a magnetic field for focusing the particle beam; wherein the magnetic lens comprises a magnetic core for channeling the magnetic field and an excitation coil for generating the magnetic field, wherein the magnetic core of the magnetic lens comprises a plurality of mutually electrically insulated parts; an objective lens which is arranged downstream of the first lens and is configured to focus the particle beam; and a controller, which is configured to operate the particle beam column in an operating mode in which the parts of the magnetic core of the magnetic lens have at least in part different electrical potentials.

The first lens can be used to increase the maximum current strength of the particle beam that can be supplied to the sample. The first lens can furthermore be used to be able to variably set the current strength of the particle beam. For this purpose, the magnetic lens of the first lens can generate upstream of the first stop, that is to say between the particle source and the first stop, a magnetic field, which is suitable for focusing the particle beam upstream of the first stop. Owing to the magnetic field, the divergence angle of the particle beam upstream of the first stop can be changed. This can bring about a change in the beam diameter in the plane of the first stop, so that the portion of the particle beam that passes through the aperture of the first stop can effectively be variably set. In this way, the current strength of the particle beam that can be transported through the aperture of the first stop can be increased and be variably set.

The parts of the magnetic core of the magnetic lens can be electrically insulated from one another and different electrical potentials are applied to the parts of the magnetic core of the magnetic lens during the operation of the particle beam column. For example, a first (for example inner) part of the magnetic core of the magnetic lens that is arranged close to the first stop can be connected to an electrical potential that substantially corresponds to the electrical potential of the first stop, while a second (for example outer) part that is further removed from the first stop is connected to a comparatively low electrical potential, for example to the potential of the housing of the particle beam generator.

These configurations of the electrical potentials of the parts of the magnetic core of the magnetic lens and of the first stop can make it possible to reduce or omit electrical insulations between these components. The space that is saved in this way can be used to optimize the arrangement and shape of the magnetic core of the magnetic lens. In this way, for example electrical insulations, which are conventionally arranged between the magnetic core and a beam tube, can be reduced or omitted. Instead, the electrical insulation of the components that during operation are at the potential of the first stop can take place farther away from the first stop, as a result of which an advantageous positioning of these parts of the magnetic core is made possible.

BRIEF DESCRIPTION OF THE DRAWINGS

Embodiments of the disclosure are explained in more detail below with reference to figures, in which.

DETAILED DESCRIPTION

Figure 1:
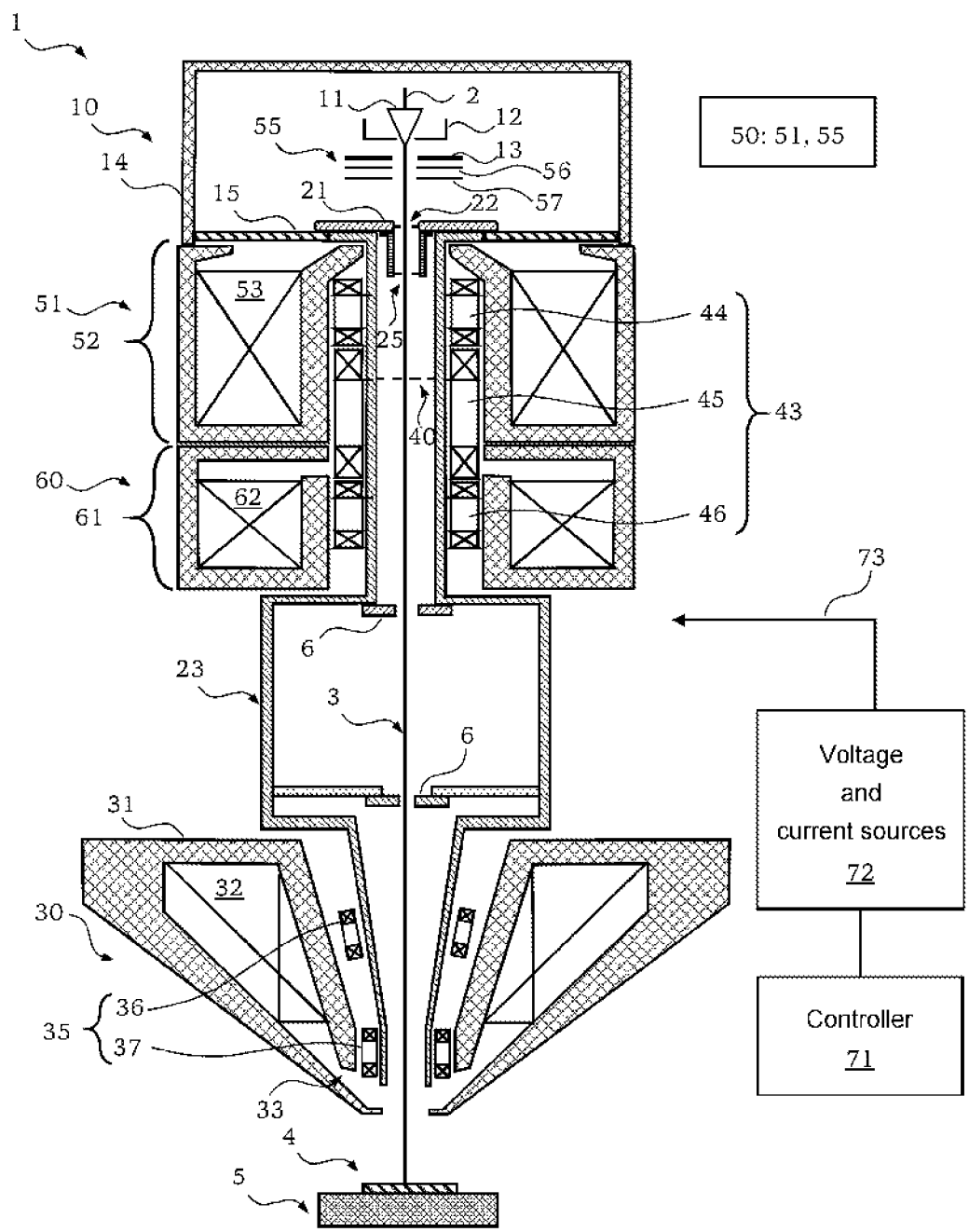
FIG. 1 shows a schematic illustration of a particle beam column.
Figure 2:
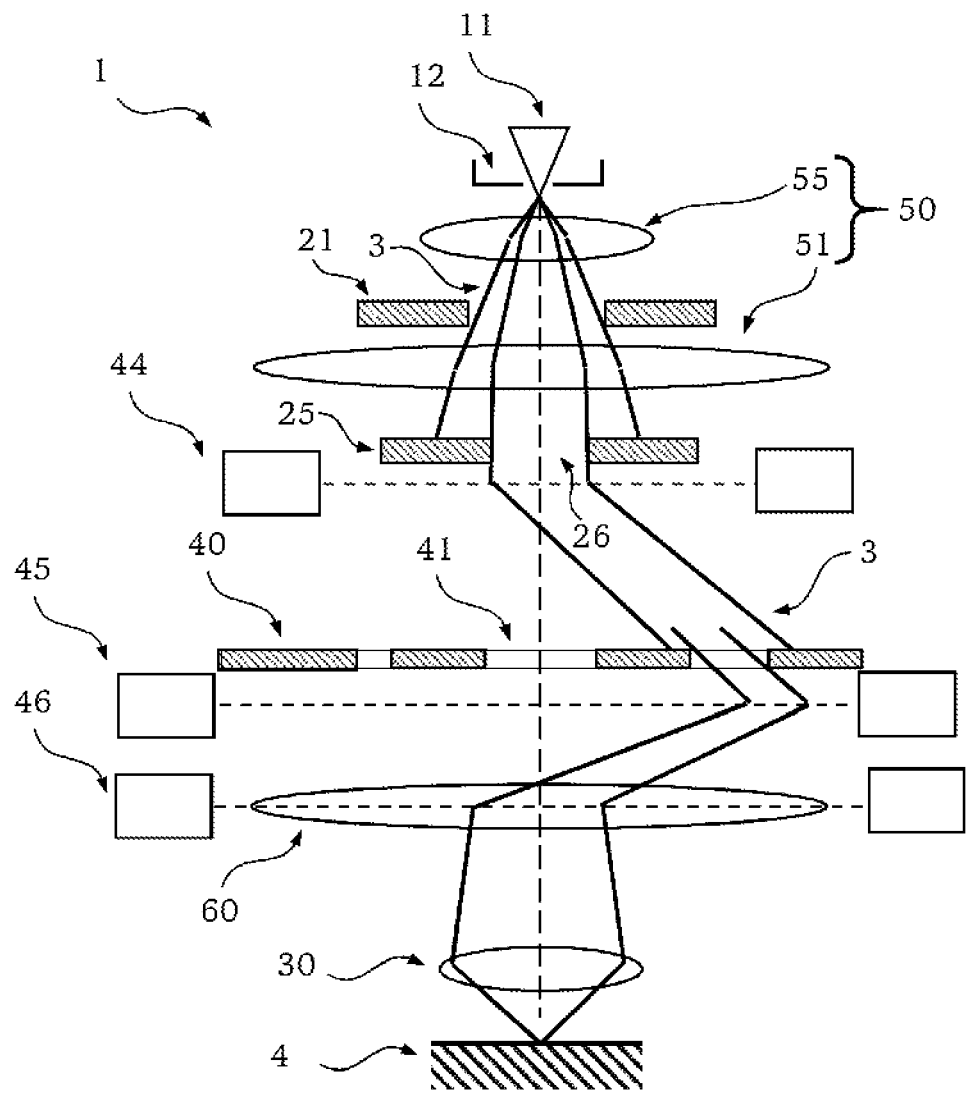
FIG. 2 shows a schematic illustration of a beam path of a particle beam through the particle beam column shown in FIG. 1.

FIG. 1 shows a schematic illustration of a particle beam column 1, in which the construction shape of the individual components and their geometric arrangement are schematically illustrated. FIG. 2 shows a schematic illustration of a beam path of a particle beam 3 produced through the particle beam column 1. In the example shown, the particle beam column 1 is a scanning electron microscope. The particle beam column 1 may, however, also be an ion beam column, for example a focused ion beam system. The particle beam column 1 may be an integral part of a particle beam system that may have a plurality of such particle beam columns having a common working region.

The particle beam column 1 comprises a particle beam generator 10 having a particle source 11, which is configured to emit charged particles, a suppression electrode 12, which is configured to block particles emitted thermally by the particle source 11 by applying an appropriate voltage, and an extraction electrode 13, which is configured to extract from the particle source 11 particles by applying an appropriate voltage (for example 0.5 kV to 6 kV with reference to the particle source 11) (referred to as field emission). The extraction electrode 13 is arranged downstream of the particle source 11. The extraction electrode 13 has an aperture through which the particle beam 3 passes.

The particle beam generator 10 furthermore comprises a housing 14 which serves as vacuum chamber and in which an ultra-high vacuum is present during operation. In the example shown in FIG. 1, the particle source 11, the suppression electrode 12 and the extraction electrode 13 are arranged within the housing 14 and thus in the ultra-high vacuum. The housing 14 comprises an electrical insulator 15 with a high magnetic resistance for electrically insulating the housing 14 from the anode stop 21, which will be described below, and the beam tube 23, which will be described later.

An anode stop 21 having an aperture 22 is arranged downstream of the particle source 11, for example downstream of the extraction electrode 13. During operation, the particle beam 3 is directed at the aperture 22 of the anode stop 21. During operation, a voltage is applied to the anode stop 21 in a manner such that the charged particles of the particle beam 3 are accelerated to a kinetic energy of the order of magnitude of 5 keV to 40 keV, such as 8 keV to 30 keV. For the purpose of simplifying FIG. 2, FIG. 2 shows trajectories of charged particles of the particle beam 3 between the particle source 11 and the anode stop 21 as straight lines; but in fact, the trajectories are curved due to the acceleration.

The particle beam column 1 furthermore comprises a beam tube 23, in which the particle beam 3 travels between the anode stop 21 and an objective lens 30. In the example shown in FIG. 1, the beam tube 23, viewed along a longitudinal direction 2 of the particle beam column 1, extends from the anode stop 21 as far as into the inside of the objective lens 30. A radial direction is oriented perpendicularly to the longitudinal direction 2. The longitudinal direction 2 is herein used synonymously for the axis of the particle beam column.

The objective lens 30 is configured to focus the particle beam 3 onto a sample 4 that is positioned on a sample holder 5. For this purpose, the objective lens 30 comprises for example a magnetic core 31 and an excitation coil 32. The excitation coil 32 is configured to generate a magnetic field that is channeled by the magnetic core 31. The magnetic field leaves the magnetic core 31 in a gap 33 of the magnetic core 31 and is formed, when excited appropriately, such that the magnetic field has a focusing effect on the particle beam 3.

A deflection system 35 is arranged along the longitudinal direction 2 level with the objective lens 30 and is configured to deflect the particle beam 3 in the radial direction in order thereby to direct the particle beam 3 onto different locations of the surface of the sample 4. The deflection system 35, in the example shown in FIG. 1, comprises two deflection units 36 and 37, which are formed from coils. In the example shown in FIG. 1, the coils of the deflection units 36 and 37 are arranged between the beam tube 23 and the magnetic core 31 of the objective lens 30. The two deflection units 36 and 37 are arranged in a manner distributed along the longitudinal direction 2.

The particle beam column 1 is embodied in an exemplary manner as an electron beam microscope. For this purpose, the particle beam column 1 comprises at least one detector 6. In the example shown, the particle beam column 1 comprises two detectors 6. The detectors 6 are designed in the manner of a stop having an aperture. The detectors 6 are arranged within the beam tube 23. The detectors 6 are arranged upstream of the objective lens 30. The detectors 6 are arranged downstream of the multi-aperture stop 40. The detectors 6 are arranged between the multi-aperture stop 40 and the objective lens 30. The particle beam 3 leaving the particle source 11 passes through the apertures in the detectors 6 and is focused on the sample 4 by the objective lens 30. Particles are emitted by the sample 4 as a result of the interaction between the particle beam 3 and the sample 4. The particles emitted by the sample 4 may be for example backscattered electrons or secondary electrons. When the particle beam column is an ion beam column, the particles emitted by the sample 4 may also be backscattered ions or secondary ions. Radiation (for example light in the form of fluorescence, cathodoluminescence, etc. or X-ray radiation) may also be emitted and detected as a result of the interaction between the particle beam 3 and the sample 4. In the example of FIG. 1, charged particles emitted by the sample 4 enter the beam tube 23 through the objective lens 30 and are detected by one of the detectors 6 depending on the trajectory.

The particle beam column 1 furthermore comprises, arranged downstream of the anode stop 21, an auxiliary stop 25 with an aperture 26, which is centred on the aperture 22 of the anode stop 21. The auxiliary stop 25 blocks a part of the particle beam 3 which is incident on the axillary stop 25 itself, and lets the remaining part of the particle beam 3 which is directed at the aperture 26 pass. The term first stop is used herein as a representative of the anode stop 21 or the auxiliary stop 25.

Figure 3:
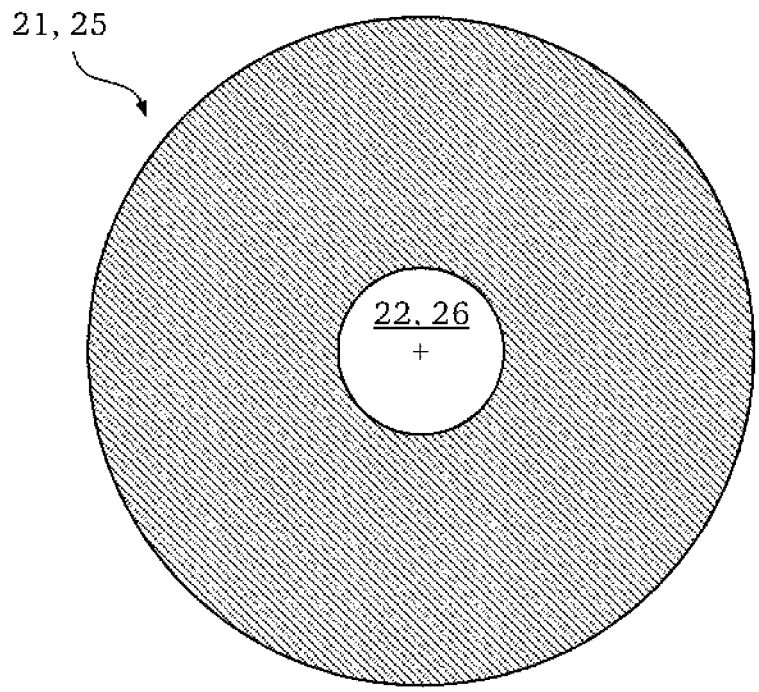
FIG. 3 shows a schematic illustration of a first stop and a multi-aperture stop of the particle beam column shown in FIG. 1.
Figure 3:
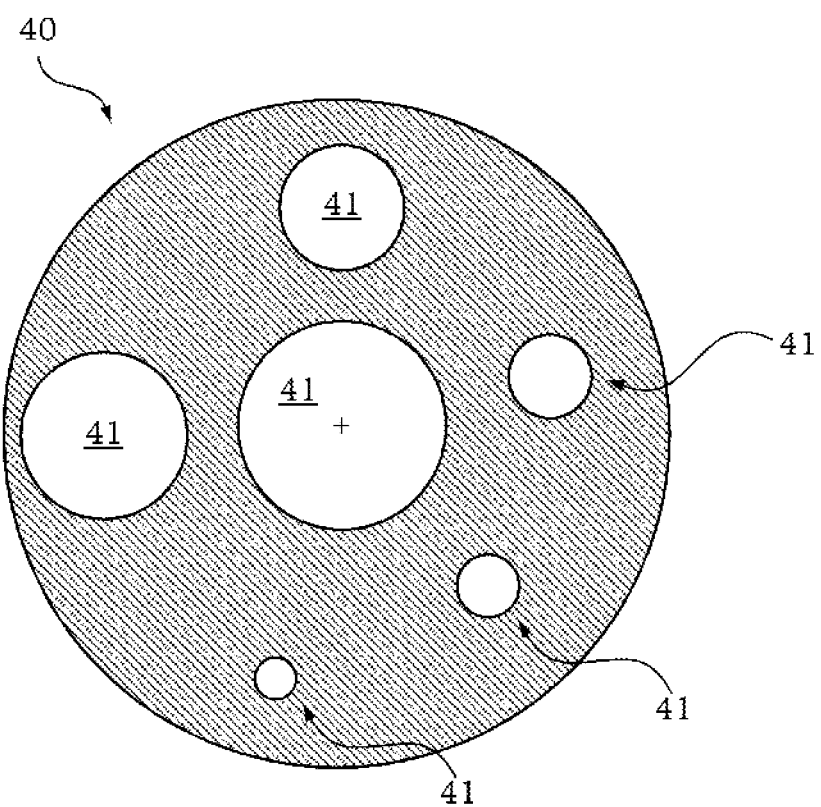

The particle beam, 1 furthermore comprises a multi-aperture stop 40 arranged downstream of the auxiliary stop 25. FIG. 3 shows a schematic illustration of the first stop 21, 25 and the multi-aperture stop 40 from a perspective along the longitudinal direction 2. The first stop 21, 25 is embodied in the form of a circular disc, with the aperture 22, 26 being arranged at the centre thereof. The longitudinal direction 2 extends centrally through the aperture 22, 26 at the location marked by a cross.

The multi-aperture stop 40 is likewise embodied in the form of a circular disc. The multi-aperture stop 40 has a plurality of circular apertures 41. The apertures 41 have different sizes. The apertures 41 are spaced apart from one another such that the apertures 41 do not overlap. The size of the apertures 41 is in the range of the diameter of the particle beam 3 in the plane in which the multi-aperture stop 40 is arranged. The multi-aperture stop 40 is therefore suitable for blocking part of the incident particle beam 3, as a result of which the current strength of the particle beam 3 is limited. Depending on the size of the aperture 41, the current strength of the particle beam 3 may be limited to different extents. This means that the apertures 41 are designed such that the current strength of the particle beam 3 upstream of the multi-aperture stop 40 is greater than the current strength of the particle beam 3 immediately after passing through the multi-aperture stop 40.

The multi-aperture stop 40 may, however, also have one or more apertures whose size is large enough to leave the current strength of the particle beam 3 unchanged. When the particle beam 3 passes through such an aperture, the current strength of the particle beam 3 is effectively limited by another stop, for example by the anode stop 21 or the auxiliary stop 25. In this case, the current strength of the particle beam 3 is not reduced upon passing through the multi-aperture stop 40.

As shown in FIGS. 1 and 2, the aperture 22, 26 of the first stop 21, 25 and the apertures 41 of the multi-aperture stop 40 can be oriented (substantially) parallel to one another.

The auxiliary stop 25 serves to delimit the diameter of the particle beam 3 to an extent such that only exactly one of the apertures 41 of the multi-aperture stop 40 is fully illuminated. That means that with appropriate deflection of the particle beam 3 by way of a deflection system 43, which will be described below, the auxiliary stop 25 delimits the diameter of the particle beam 3 in a manner such that the diameter of the particle beam 3 in the plane in which the multi-aperture stop 40 is arranged is merely large enough so that the particle beam is directed onto only one of the apertures 41 of the multi-aperture stop 40.

The particle beam column 1 furthermore comprises a deflection system 43 that is configured to selectively deflect the particle beam 3 through one of the apertures 41 of the multi-aperture stop 40. In the example shown in FIG. 1, the deflection system 43 comprises three deflection units 44, 45 and 46. Each of the deflection units 44 to 46 is configured to deflect the particle beam 3 in the radial direction. To deflect the particle beam 3 means to change the direction of the particle beam 3. In the example shown in FIG. 1, the deflection units 44 to 46 comprise coils. The deflection units 44 to 46 are controlled synchronously. The coils of the deflection units 44 to 46 are arranged outside the beam tube 23. Deflection units with an electrical action are also possible instead of magnetic deflection units in the form of coils.

The deflection unit 44 is configured to deflect the particle beam between the first stop 21, 25 and the multi-aperture stop 40. The particle beam 3 may thereby be selectively directed onto (precisely) one of the apertures 41 of the multi-aperture stop 40. When the particle beam 3 is directed onto one of the apertures 41 of the multi-aperture stop 40 and in the process is partially incident on the multi-aperture stop 40 itself, the particle beam 3 is partially blocked by the multi-aperture stop 40, as a result of which the current strength of the particle beam 3 is set. The current strength of the particle beam 3 may thus be set to different values in dependence on the size of the apertures 41.

After passing through the multi-aperture stop 40, the particle beam 3 is deflected again by the further deflection units 45 and 46 and thereby directed onto the objective lens 30. The deflection units 45 and 46 are configured to deflect the particle beam 3 between the multi-aperture stop 40 and the objective lens 30 in the radial direction.

The multi-aperture stop 40 and the deflection system 43 make it possible that the current strength of the particle beam 3 can be set to different values. This creates a dynamic range for the current strengths of the particle beam 3.

In order to increase, in addition to the dynamic range of the current strength of the particle beam 3, also the maximum value of the current strength of the particle beam 3 and make it settable, the particle beam column 1 furthermore comprises a first lens 50, which is configured to variably set a divergence angle of the particle beam 3, as a result of which the current strength of the particle beam 3 passing through the aperture of the first stop 21, 25 is variably settable.

The first lens 50 can be or comprise a magnetic lens 51. The magnetic lens 51 is configured to generate a magnetic field for focusing the particle beam 3 between the particle source 11 and the multi-aperture stop 40, for example upstream of the first stop 21, 25.

The magnetic lens 51 comprises a magnetic core 52 for channeling the magnetic field and an excitation coil 53 for generating the magnetic field. The magnetic core 52 is designed to be substantially rotationally symmetrical about the longitudinal direction 2. For the purpose of simplifying the illustration, the housing 14 and the magnetic cores 52, 61, 31 of all the magnetic lenses 51, 60, 30 are illustrated in FIG. 1 in each case only as a (single) component part. The magnetic core 52 is arranged entirely outside of the particle beam generator 10, that is to say outside of the housing 14 of the particle beam generator 10, and outside of the beam tube 23. The magnetic core 52 is arranged downstream of the anode stop 21 in the longitudinal direction 2. The magnetic core 52 is formed such that the magnetic field generated by the magnetic lens 51 acts primarily upstream of the first stop 21, 25, for example between the anode stop 21 and the auxiliary stop 25, as is shown by way of example in FIG. 2.

The first lens 50 can be or comprise an electrostatic lens 55. The electrostatic lens 55 is arranged downstream of the particle source 11 and the suppression electrode 12 and upstream of the beam tube 23 and the anode stop 21. The electrostatic lens 55 is arranged within the housing 14. The electrostatic lens 55 is formed by the extraction electrode 13 and a further stop 56, which is arranged downstream of the extraction electrode 13. The electrostatic lens 55 can comprise an additional stop 57, which is arranged downstream of the stop 56. The additional stop 57 improves the effect of the electrostatic lens 55. The stops 56 and 57 each have an aperture through which the particle beam 3 passes during operation.

The electrostatic lens 55 is operated, for example, as follows during operation: The electrical potential UGL applied to the stop 56 is set to a value from the range UE−4 kV to UE+15 kV, wherein UE is the electrical potential applied to the extraction electrode 13. The electrical potential UGH applied to the stop 57 is set to a value from the range UE−3 kV to UE+3 kV, wherein UE is the electrical potential applied to the extraction electrode 13. For example, UH can be set to UH=UE by connecting the stop 57 electrically conductively to the extraction electrode 13.

The magnetic lens 51 and the electrostatic lens 55 have a similar effect to the extent that both are suitable for allowing the variable setting of the divergence angle of the particle beam 3 between the particle source 11 and the anode stop 21. It is therefore sufficient if the particle beam column 1 comprises either the magnetic lens 51 or the electrostatic lens 55. However, the particle beam column 1 can also comprise both the magnetic lens 51 and the electrostatic lens 55.

The first lens 50 brings about, by focusing the particle beam 3, a change in the divergence angle of the particle beam 3 upstream of the auxiliary stop 25, more specifically between the anode stop 21 and the auxiliary stop 25. The diameter of the particle beam 3 in the plane in which the auxiliary stop 25 is arranged is hereby variably settable. The effect of this is that the maximum current strength of the particle flux 3 passing through the aperture 26 of the auxiliary stop 25 can be increased. In addition, the change in the divergence angle also brings about a change in the beam current density of the particle beam 3 in the plane of the multi-aperture stop 40, with the result that the current strength of the particle beam 3 is continuously variably settable. This is accomplished by the portion of the particle beam passing through the selected aperture being continuously variably settable by changing the divergence angle of the particle beam with respect to the portion of the particle beam that is blocked by the multi-aperture stop.

The excitation of the first lens 50 can be set such that during operation (independently of the aperture 41 of the multi-aperture stop 40 that is selected by way of the deflection system 43) the divergence angle of the particle beam 3 is set such that the particle beam 3 has no crossover upstream of the multi-aperture stop 40. In this way, an interfering Coulomb interaction between the particles of the particle beam 3 is reduced.

Alternatively, the excitation of the first lens 50 can be set such that during operation (independently of the aperture 41 of the multi-aperture stop 40 that is selected by way of the deflection system 43) the divergence angle of the particle beam 3 is set such that the particle beam 3 has a crossover upstream of or in the region of the multi-aperture stop 40. In this way, the maximum current strength of the particle beam which can pass through the multi-aperture stop 40 can be increased.

The particle beam column 1 furthermore comprises a second lens 60, which is configured to generate a magnetic field for focusing the particle beam 3 downstream of the multi-aperture stop 40, that is to say, between the multi-aperture stop 40 and the objective lens 30. The second lens 60 serves to adapt the particle beam 3 to the objective lens 30, as is shown by way of example in FIG. 2. The excitation of the second lens 60 can be controlled in dependence on the excitation of the first lens 50. Accordingly, the two lenses 50, 60 can be excited in a synchronous manner so that they are adapted to each other.

The second lens 60 comprises a magnetic core 61 for channeling the magnetic field generated by an excitation coil 62. The magnetic core 61 is designed to be substantially rotationally symmetrical about the longitudinal direction 2. The magnetic core 61 is arranged downstream of the first lens 50 outside of the beam tube 23.

The particle beam column 1 furthermore comprises one or more voltage and current sources 72 in order to provide desired voltages and currents to the components of the particle beam column 1. For example, the voltage and current sources 72 generate the voltages and currents for the particle source 11, the suppression electrode 12, the extraction electrode 13, the anode stop 21, the beam tube 23, the auxiliary stop 25, the excitation coils 32, 53, 62, the deflection units 36, 37, 44, 45, 46 and the stops 56, 57. A line 73 represents all of the lines that are used to guide the voltages and currents from the voltage and current sources 72 to the components of the particle beam column 1. The line 73 is illustrated only schematically.

The particle beam column 1 furthermore comprises a controller 71 for controlling the components of the particle beam column 1, for example for controlling the voltage and current sources 72. The controller 71 can operate the particle beam column 1 in different operating modes.

In accordance with one exemplary operating mode, the components of the particle beam column 1 are connected as follows. The housing 14 of the particle beam generator 10, the magnetic core 52 of the magnetic lens 51, the magnetic core 61 of the second lens 60 and a housing of the particle beam column 1 substantially have the same electrical potential P0, which is referred to as ground potential 0V. The housing 14 of the particle beam generator 10, the magnetic core 52 of the magnetic lens 51 and a magnetic core 61 of the second lens 60 can be electrically conductively connected to one another, with the result that they always substantially have the same electrical potential during operation.

The anode stop 21, the auxiliary stop 25 and the beam tube 23 in this operating mode have substantially the same electrical potential P1, which differs from the potential P0. The potential P1 is selected such that the particles of the particle beam 3 are accelerated towards the anode stop 21. The potential difference between P1 and P0 is, for example, at least 1 kV, such as at least 5 kV or at least 8 kV. The anode stop 21, the beam tube 23 and the auxiliary stop 25 can be electrically conductively connected to one another, with the result that they always have substantially the same electrical potential. The multi-aperture stop 40 can substantially have the same electrical potential P1.

The housing 14 of the particle beam generator 10, the magnetic core 52 of the magnetic lens 51, the excitation coil 53 of the magnetic lens 51, the magnetic core 61 of the second lens 60, the excitation coil 62 of the second lens 60 and a housing of the particle beam column 1 can each be connected to ground potential 0V. The anode stop 21, the auxiliary stop 25 and the beam tube 23 can each have an electrical potential such that a voltage between the anode stop 21, the auxiliary stop 25 and the beam tube 23, respectively, and the ground potential is at least 1 kV or at least 3 kV.

Figure 4:
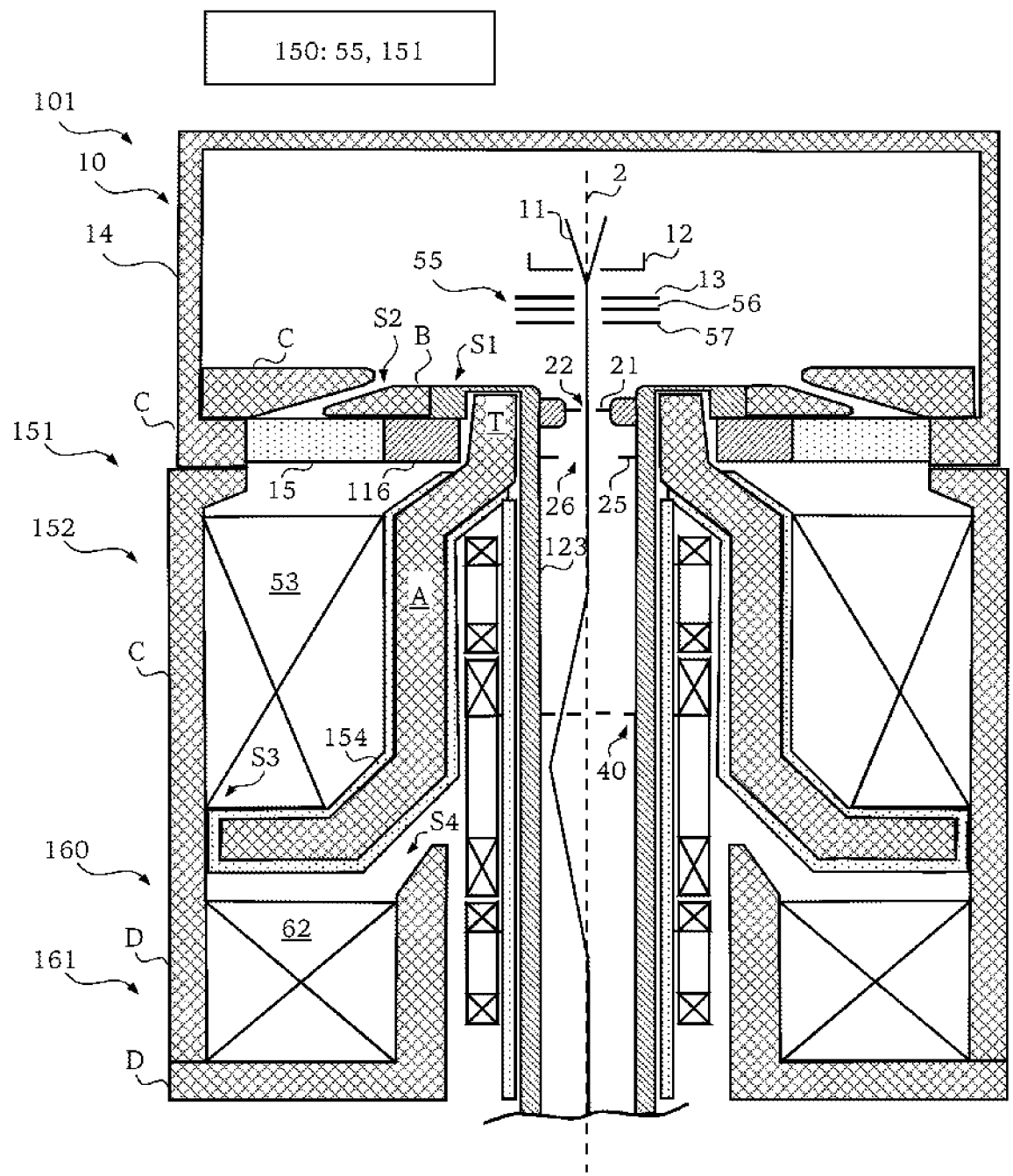
FIG. 4 shows a schematic illustration of a part of a further particle beam column.
Figure 5:
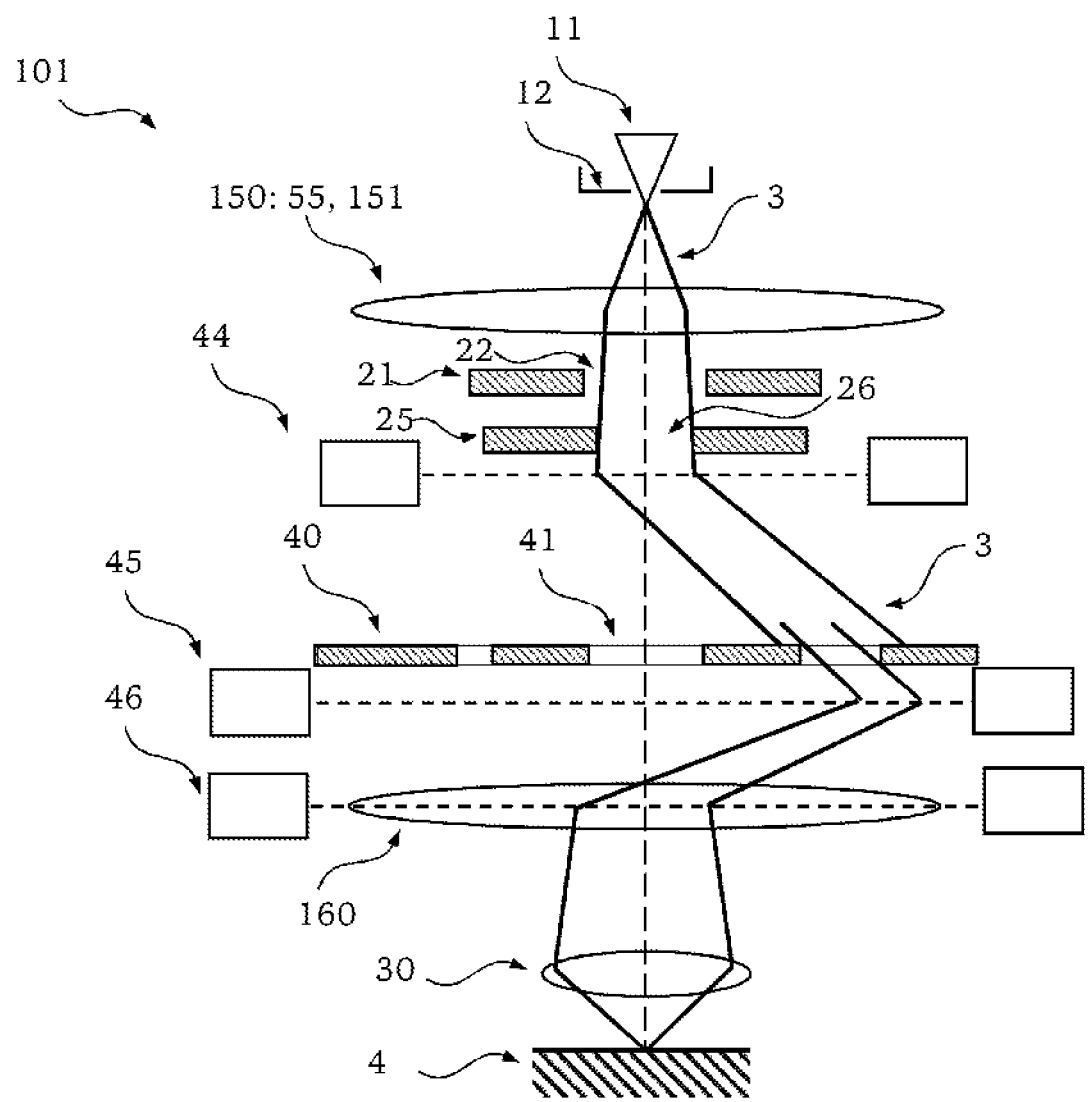
FIG. 5 shows a schematic illustration of a beam path of a particle beam through the particle beam column shown in FIG. 4.

A further particle beam 101 is described below with reference to FIGS. 4 and 5. FIG. 4 shows a schematic illustration of a part of the further particle beam column 101, which substantially corresponds to the particle beam column 1 shown in FIG. 1. Mainly the differences compared to the particle beam column 1 will be described below.

Components that are identical in the particle beam columns 1 and 101 are provided with the same reference signs. Reference is made to the description above in respect of identical components.

The particle beam column 101 differs from the particle beam column 1 mainly in terms of the configuration of the first lens 150 and the second lens 160, in terms of the manner of operation of the first lens 150 and the second lens 160 and in terms of the configuration of the beam tube 123.

In the particle beam column 101, the beam tube 123 extends, viewed along the longitudinal direction 2 of the particle beam column 101, from a region between the extraction electrode 13 and the anode stop 21 up to the inside of the objective lens 30.

The first lens 150 is configured to variably set a divergence angle of the particle beam 3 upstream of the auxiliary stop 25, for example upstream of the anode stop 21.

The first lens 150 comprises a magnetic lens 151, which is configured to generate a magnetic field for focusing the particle beam 3 in order to thereby variably set the divergence angle of the particle beam 3 and increase the maximum current strength of the particle beam 3 passing through the aperture 22, 26 of the first stop 21, 25. The first lens 150 can furthermore comprise the electrostatic lens 55.

In the following text, an exemplary configuration of the magnetic lens 151 of the first lens 150 according to the second and third aspects of the present disclosure will be described with reference to FIGS. 4 and 5. To ensure that the magnetic lens 151 can generate, upstream of the anode stop 21, that is to say between the extraction electrode 13 of the particle beam generator 10 and the anode stop 21, a magnetic field that can focus the particle beam 3, the magnetic lens 151 comprises a magnetic core 152, which, viewed in the longitudinal direction 2, extends relatively close to the extraction electrode 13.

The magnetic coil 152 serves for channeling a magnetic field generated by the excitation coil 53. The magnetic core 152 is designed to be substantially rotationally symmetrical about the longitudinal direction 2. The magnetic core 152 comprises a plurality of parts A to C, which together form the magnetic core 152. The parts A and B are arranged relatively close to the anode stop 21. Of the parts A to C of the magnetic core 152, the part A is arranged closest to the extraction electrode 13 and the anode stop 21. Viewed in the longitudinal direction 2, the magnetic core 152 is arranged in part upstream of the anode stop 21.

The part A and the part B are spaced apart from one another in the radial direction at the level of the anode stop 21, and a part of the beam tube 123 lies between the parts A and B. While the parts A to C of the magnetic core 152 can be formed from a material having a low magnetic resistance, the beam tube 123 can be formed from a material having a high magnetic resistance. A low magnetic resistance can be provided for example by a soft magnetic material. A high magnetic resistance can be provided for example by a non-ferromagnetic material. Therefore, a "gap" S1 with a high magnetic resistance and a low electrical resistance is located between the parts A and B of the magnetic core 152. The gap S1 defines the greatest magnetic resistance within the magnetic core 152 of the magnetic lens 151. Accordingly, a strong magnetic field emerges from the magnetic core 152 via the gap S1. The parts A and B can be shaped and arranged such that the gap S1 lies, viewed in the longitudinal direction, upstream of the anode stop 21. This magnetic field serves for focusing the particle beam 3 upstream of the anode stop 21. The part B is carried by a holder 116, which is carried via the electrical insulator 15 at the housing 14.

The part B and the part C are spaced apart from each other in the radial direction at the level of the anode stop 21, as a result of which a gap S2 having a low magnetic resistance and a high electrical resistance is formed between the part B and the part C. In order to keep the magnetic resistance between the parts B and C low and still ensure a sufficiently good electrical insulation, the parts B and C are bevelled in the region of the gap S2 in order to thereby provide a large cross-sectional surface for transferring the magnetic field (or the magnetic flux).

The part C in FIG. 4 is formed by a plurality of segments, which, however, have a low electrical resistance and a load magnetic resistance. The parts A and C are spaced apart from each other in the radial direction, as a result of which a gap S3 having a low magnetic resistance and a high electrical resistance is formed between the part A and the part C. The part A is surrounded in the region of the excitation coil 53 by an electrical insulator 154. The parts A and C are electrically insulated from one another by the gap S3 and the electrical insulator 154.

Due to the electrical insulation of the parts A and B of the magnetic core 152 from the part C of the magnetic core 152, it becomes possible that the parts A and B of the magnetic core 152 can have substantially the same electrical potential as the beam tube 123 during operation. This in turn makes it possible for the part A of the magnetic core 152 to be arranged very close to the beam tube 123 or very close to the anode stop 21 because electrical insulations can be reduced or omitted due to the substantially same electrical potential. This additional leeway in the geometric design and arrangement of the part A of the magnetic core 152 is utilized according to the disclosure to extend the part A or the gap S1 into a region that lies, viewed along the longitudinal direction 2, between the anode stop 21 and the particle source 11, as is shown in FIG. 4. As a result it is possible for the magnetic field between the anode stop 21 and the particle source 11 to be relatively pronounced at a distance from the anode stop 21, as is shown schematically in FIG. 5. The maximum current strength of the particle beam 3 which can be directed onto the sample 4 can in turn be increased in this way.

The previously described configuration of the magnetic lens 151 of the first lens 150, according to which the magnetic core 152 comprises a multiplicity of parts A, B, C which are partially electrically insulated from one another, offers more leeway for designing the geometry of the parts of the magnetic core 152. Therefore, parts of the magnetic core 152 can in part be arranged very close to and even upstream of the anode stop 21. As a consequence, a strong magnetic field can be formed upstream of the anode stop 21, as a result of which the maximum value of the current strength of the particle beam 3 which can pass through the aperture 22 in the anode stop 21 can in turn be increased.

The magnetic core 152 of the magnetic lens 151 is partially arranged outside of the ultra-high vacuum which is maintained by the housing 14 of the particle beam generator 10. In the example shown in FIG. 4, the part A of the magnetic core 152 is arranged entirely outside of the ultra-high vacuum, the part B of the magnetic core 152 is arranged entirely inside the ultra-high vacuum, and the part C of the magnetic core 152 is an integral part of the housing 14 and is thus arranged partially inside and partially outside of the ultra-high vacuum.

The second lens 160 comprises a magnetic core 161 for channeling a magnetic field generated by the excitation coil 62. The magnetic core 161 is designed to be substantially rotationally symmetrical about the longitudinal direction 2. The magnetic core 161 comprises a plurality of parts, that is, the part A and a part D in the example of FIG. 4.

The parts A and D of the magnetic core 161 are spaced apart and electrically insulated from one another by the gaps S3 and S4. Therefore, different electrical potentials can be applied to the parts A and D during operation. While the gap S3 has a low magnetic resistance due to its geometric design, the gap S4 has a higher magnetic resistance. The gap S4 defines the greatest magnetic resistance within the magnetic core 161 of the second lens 160. In the region of the gap S4, which lies, viewed in the longitudinal direction 2, downstream of the multi-aperture stop 40, a strong magnetic field that is suitable for focusing the particle beam 3 can thus be generated by the second lens 160.

In accordance with one exemplary operating mode, the components of the particle beam column 101 are connected as follows.

The part C of the magnetic core 152 of the magnetic lens 151, the part D of the magnetic core 161 of the second lens 160 and an outer part of the housing 14 substantially have the same electrical potential P0, which is referred to as ground potential 0V. For this purpose, the part C of the magnetic core 152 of the magnetic lens 151, the part D of the magnetic core 161 of the second lens 160 and the outer part of the housing 14 can be electrically conductively connected.

The anode stop 21, the auxiliary stop 25, the beam tube 123 and the parts A and B of the magnetic core 152 of the magnetic lens 151 have during operation substantially the same electrical potential P1, which differs from the potential P0. The potential P1 is selected such that the particles of the particle beam 3 are accelerated towards the anode stop 21. The potential difference between P1 and P0 is, for example, at least 1 kV, such as at least 5 kV or at least 8 kV. The anode stop 21, the beam tube 123, the auxiliary stop 25 and the parts A and B of the magnetic core 152 of the magnetic lens 151 can be electrically conductively connected to one another, with the result that they always substantially have the same electrical potential during operation.

The sample 4 or the sample holder 5 can also be electrically connected to an electrical potential P2. The electrical potential P2 can be the same as the potential P0 or can be different from the potential P0. In an exemplary operating mode, the potentials P1 and P2 are produced such that there is, between the first stop (that is to say the anode stop 21 or the auxiliary stop 25) and the sample 4 or the sample holder 5, a voltage of a few hundred to a few thousand volts.

The housing 14 of the particle beam generator 10, the part C of the magnetic core 152 of the magnetic lens 151, the excitation coil 53 of the magnetic lens 151, the part D of the magnetic core 161 of the second lens 60, the excitation coil 62 of the second lens 60 and a housing of the particle beam column 1 can each be connected to ground potential 0V. The anode stop 21, the auxiliary stop 25 and the beam tube 123 can each have an electrical potential such that a voltage between the anode stop 21, the auxiliary stop 25 and the beam tube 123, respectively, and the ground potential is at least 1 kV or at least 3 kV.

Two electrodes (parts, stops) have substantially the same potential, for example, when a voltage of less than 500 V, such as less than 100 V, for example less than 50 V, is present between the two electrodes. This can be accomplished by way of the two electrodes being electrically conductively connected to each other. Alternatively, this can be accomplished by substantially the same electrical potential being applied to the two electrodes, for example using one or more voltage sources.

The components of the particle beam columns 1, 101 can be controlled by the controller 71. The controller can comprise a plurality of control elements, which each provide a function of the controller 71. The controller 71 may be implemented by hardware and/or by software. The controller 71 can comprise a plurality of individual devices, which are connected to one another via one or more networks.

For example, the controller 71 comprises a control element for controlling the particle beam generator 10, for example (a) control element(s) for controlling voltages to be applied to the suppression electrode 12 and the extraction electrode 13. By way of example, the controller 71 comprises a control element for controlling a voltage to be applied to the anode stop 21. By way of example, the controller 71 comprises a control element for controlling a voltage to be applied to the beam tube 23, 123.

By way of example, the controller 71 comprises a control element for controlling an electric current to be supplied to the magnetic lens 51, 151 of the first lens 50, 150 or to its excitation coil 53. By way of example, the controller 71 comprises a control element for controlling a voltage to be supplied to the electrostatic lens 55 of the first lens 50, 150. By way of example, the controller 71 comprises a control element for controlling an electric current to be supplied to the second lens 60, 160 or to its excitation coil 62. By way of example, the controller 71 comprises a control element for controlling an electric current to be supplied to the objective lens 30 or to its excitation coil 32.

By way of example, the controller 71 comprises a control element for controlling an electric current/voltage to be supplied to the deflection system 43 or its deflection units 44 to 46. By way of example, the controller 71 comprises a control element for controlling an electric current/voltage to be supplied to the deflection system 35 or its deflection units 36, 37.

By way of example, the controller 71 comprises a control element for controlling a voltage to be applied to the sample 4 or to the sample holder 5.

All voltages and currents used for operating the individual components of the particle beam columns 1, 101 can be provided by one or more voltage sources and current sources 72. The voltage sources and current sources 72 are controlled by the controller 71. In this way, the controller 71 can instruct the voltage and current sources 72 to generate voltages and currents in accordance with different operating modes.

What is claimed is:
1. A particle beam column, comprising:
 a particle beam generator configured to generate a particle beam of charged particles;
 a first stop comprising an aperture onto which the particle beam is directed during operation of the particle beam column;
 a first lens comprising at least one of a magnetic lens or an electrostatic lens that is configured to receive at least one of a voltage signal or a current signal from at least one of a voltage source or a current source, and in response to the at least one of the voltage signal or the current signal generate at least one of a magnetic field or an electric field and variably set a divergence angle of the particle beam upstream of the first stop along a path of the particle beam to variably set a current strength of the particle beam passing through the aperture during operation of the particle beam column;
 a multi-aperture stop downstream of the first stop along the particle beam path, the multi-aperture stop comprising a plurality of differently sized apertures next to each other;
 a deflection system configured to selectively deflect the particle beam downstream of the first stop along the particle beam path and onto one of the apertures of the multi-aperture stop during operation of the particle beam column; and
 an objective lens arranged downstream of the multi-aperture stop along the particle beam path and configured to focus the particle beam passing through one of the apertures of the multi-apertures of the multi-aperture stop during operation of the particle beam column,
 wherein the first lens is configured to set, in response to at least one of the voltage signal or the current signal being at a particular value and in interaction with the first stop, the divergence angle of the particle beam during operation of the particle beam column so that the particle beam is directed onto exactly one of the apertures of the multi-aperture stop.

2. The beam column of claim 1, wherein the first stop and the multi-aperture stop have the same electrical potential during operation of the particle beam column.

3. The beam column of claim 1, further comprising a control element comprising hardware, with or without software, configured to operate the first lens so that the particle beam has no crossover upstream of the multi-aperture stop during operation of the particle beam column.

4. The beam column of claim 1, further comprising a control element comprising hardware, with or without software, configured to operate the first lens so that the particle beam has a crossover upstream of the multi-aperture stop during operation of the particle beam column.

5. The beam column of claim 1, further comprising a second lens configured to variably set the divergence angle of the particle beam between the multi-aperture stop and the objective lens during operation of the particle beam column.

6. The particle beam column of claim 5, further comprising a control element comprising hardware, with or without software, configured to control an excitation of the second lens depending on an excitation of the first lens.

7. The beam column of claim 1, wherein the deflection system is configured to deflect the particle beam between the multi-aperture stop and the objective lens during operation of the particle beam column.

8. The beam column of claim 1, wherein the first lens comprises at least one member selected from the group consisting of a magnetic lens and an electrostatic lens.

9. The beam column of claim 1, wherein the first lens is configured to continuously variably set the portion of the particle beam passing through the exactly one aperture of the multi-aperture stop by changing the divergence angle of the particle beam upstream of the first stop with respect to the portion of the particle beam that is blocked by the multi-aperture stop during operation of the particle beam column.

10. The beam column of claim 1, further comprising a detector between the multi-aperture stop and the objective lens along the particle beam path, wherein the detector is configured to detect particles or radiation during operation of the particle beam column.

11. The particle beam column of claim 1, wherein:
the first stop is an auxiliary stop configured to delimit a diameter of the particle beam; and
the particle beam column further comprises an anode stop upstream of the first stop along the particle beam path, the anode stop comprising an aperture through which the particle beam passes during operation of the particle beam column; and
the first lens is configured to variably set the divergence angle of the particle beam between the anode stop and the first stop.

12. The beam column of claim 1, wherein the first stop is an anode stop configured to accelerate the particles of the particle beam.

13. The particle beam column of claim 11, further comprising an auxiliary stop, downstream of the anode stop along the particle beam, wherein the auxiliary stop comprises an aperture configured to delimit a diameter of the particle beam, and the aperture of the auxiliary stop is centered on the aperture of the anode stop.

14. The particle beam column of claim 1, further comprising a beam tube in which the particle beam travels during operation of the particle beam column, wherein:
the beam tube and the first stop have the same electrical potential during operation of the particle beam column; and
the electrical potential is selected so that a potential difference between the electrical potential of the beam tube and the first stop and an electrical potential of a housing of the particle beam generator is at least 1 kV.

15. A particle beam column, comprising:
a particle beam generator configured to generate a particle beam of charged particles;
a first stop comprising an aperture through which the particle beam passes during operation of the particle beam column;
a first lens comprising a magnetic lens, the first lens configured to generate, upstream of the first stop along a path of the particle beam, a magnetic field to focus the particle beam during operation of the particle beam column, the magnetic lens comprising a magnetic core configured to channel the magnetic field and an excitation coil configured to generate the magnetic field;
an objective lens downstream of the first lens along the particle beam path, the objective lens configured to focus the particle beam onto a sample during operation of the particle beam column;
a voltage source; and
a controller comprising a hardware voltage control element, with or without software, configured to control the voltage source and operate the particle beam column in an operating mode in which the voltage control element is configured to control the voltage source to provide a voltage that is applied between the first stop and the sample or between the first stop and a sample holder on which the sample is positioned and in which at least a first part of the magnetic core of the magnetic lens and the first stop substantially have the same electrical potential.

16. The particle beam column of claim 15, wherein the at least one first part of the magnetic core of the magnetic lens is close to the first stop.

17. The particle beam column of claim 15, wherein the at least one first part of the magnetic core of the magnetic lens has a section arranged, when viewed along a longitudinal direction of the particle beam column, upstream of the first stop.

18. The particle beam column of claim 15, wherein the magnetic core of the magnetic lens comprises a plurality of parts which are electrically insulated from one another.

19. The particle beam column of claim 18, wherein, when the controller operates the particle beam column in the operating mode, the parts of the magnetic core of the magnetic lens have at least in part different electrical potentials.

20. The particle beam column of claim 15, wherein the at least one first part of the magnetic core of the magnetic lens and the first stop are electrically conductively connected to one another.

21. A particle beam column, comprising:
a particle beam generator configured to generate a particle beam of charged particles;
a first stop comprising an aperture through which the particle beam passes during operation of the particle beam column;
a first lens comprising a magnetic lens, the first lens configured to generate, upstream of the first stop along a path of the particle beam, a magnetic field to focus the particle beam during operation of the particle beam column, the magnetic lens comprising a magnetic core configured to channel the magnetic field and an excitation coil configured to generate the magnetic field, the magnetic core of the magnetic lens comprising a plurality of parts which are electrically insulated from one another;
an objective lens downstream of the first lens along the particle beam path, the objective lens configured to focus the particle beam during operation of the particle beam column;
a voltage source; and
a controller comprising a hardware voltage control element, with or without software, configured to control the voltage source and operate the particle beam column in an operating mode in which the voltage control element is configured to control the voltage source to provide one or more voltage signals to the parts of the magnetic lens to cause the parts of the magnetic core of the magnetic lens to have at least in part different electrical potentials.

22. The particle beam column of claim 21, wherein, when the controller operates the particle beam column in the operating mode, a group of parts of the parts of the magnetic core of the magnetic lens, between which the magnetic field is formed, have substantially the same electrical potential.

23. The particle beam column of claim 21, further comprising a second lens configured to generate a magnetic field to focus the particle beam between the first stop and the objective lens during operation of the particle beam column.

24. The particle beam column of claim 21, wherein the magnetic core of the magnetic lens is at least partially within a high-vacuum region of by the particle beam generator during operation of the particle beam column.

* * * * *